(12) United States Patent
Zheng et al.

(10) Patent No.: US 10,242,958 B2
(45) Date of Patent: Mar. 26, 2019

(54) HIGH-VOLTAGE LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Gaolin Zheng, Xiamen (CN); Ling-yuan Hong, Xiamen (CN); Xiaoxiong Lin, Xiamen (CN); Feng Wang, Xiamen (CN); Su-hui Lin, Xiamen (CN); Chia-hung Chang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/810,076

(22) Filed: Nov. 12, 2017

(65) Prior Publication Data

US 2018/0076152 A1     Mar. 15, 2018

Related U.S. Application Data

(63) Continuation of application No. PCT/CN2016/097874, filed on Sep. 2, 2016.

(30) Foreign Application Priority Data

Dec. 25, 2015     (CN) .......................... 2015 1 0987688

(51) Int. Cl.
*H01L 21/00* (2006.01)
*H01L 27/00* (2006.01)
(Continued)

(52) U.S. Cl.
CPC ............ *H01L 23/60* (2013.01); *H01L 27/153* (2013.01); *H01L 33/0079* (2013.01);
(Continued)

(58) Field of Classification Search
CPC ... H01L 23/60; H01L 23/5226; H01L 23/535; H01L 27/15; H01L 27/153; H01L 27/124;
(Continued)

(56) References Cited

U.S. PATENT DOCUMENTS

7,511,311 B2 *   3/2009   Kususe .................. H01L 24/06
                                                    257/94
8,987,772 B2 *   3/2015   Kim ..................... H01L 33/0008
                                                    257/99
(Continued)

*Primary Examiner* — Nikolay K Yushin
(74) *Attorney, Agent, or Firm* — Syncoda LLC; Feng Ma (57) ABSTRACT

A fabrication method of a high-voltage light-emitting diode includes the steps of providing a substrate, and forming a light-emitting epitaxial laminated layer on the substrate; patterning the light-emitting epitaxial laminated layer and fabricating a channel that exposes the substrate surface so as to divide the light-emitting epitaxial laminated layer into a plurality of light-emitting diode units, and the light-emitting diode units at least constitute two rows; fabricating an electrode interconnection line crossing the channel, wherein, two adjacent light-emitting diode units are connected by the electrode interconnection line; fabricating an electrode bonding pad over the outmost light-emitting diode unit of the high-voltage light-emitting diode; and fabricating an insulating protective layer opening at the channel where the potential difference of any two adjacent light-emitting diodes is ≥3 times of the forward voltage of a single light-emitting diode to avoid breakdown of the light-emitting epitaxial laminated layer.

15 Claims, 7 Drawing Sheets

(51) Int. Cl.
*H01L 33/00* (2010.01)
*H01L 23/60* (2006.01)
*H01L 27/15* (2006.01)
*H01L 33/38* (2010.01)
*H01L 33/62* (2010.01)
*H01L 33/64* (2010.01)
*H01L 33/44* (2010.01)

(52) U.S. Cl.
CPC .......... *H01L 33/382* (2013.01); *H01L 33/385* (2013.01); *H01L 33/44* (2013.01); *H01L 33/62* (2013.01); *H01L 33/648* (2013.01); *H01L 33/38* (2013.01); *H01L 2933/0016* (2013.01)

(58) Field of Classification Search
CPC ... H01L 27/3276; H01L 33/00; H01L 33/648; H01L 33/382; H01L 33/385; H01L 33/62; H01L 33/0079
See application file for complete search history.

(56) References Cited

U.S. PATENT DOCUMENTS

| | | | |
|---|---|---|---|
| 2006/0231852 A1* | 10/2006 | Kususe | H01L 24/06 257/99 |
| 2013/0234192 A1* | 9/2013 | Kim | H01L 33/0008 257/98 |
| 2016/0172342 A1* | 6/2016 | Wu | H01L 27/156 257/93 |

* cited by examiner

HIGH-VOLTAGE LIGHT EMITTING DIODE AND FABRICATION METHOD THEREOF

CROSS-REFERENCE TO RELATED APPLICATIONS

The present application is a continuation of, and claims priority to, PCT/CN2016/097874 filed on Sep. 2, 2016, which claims priority to Chinese Patent Application No. 201510987688.1 filed on Dec. 25, 2015. The disclosures of these applications are hereby incorporated by reference in their entirety.

BACKGROUND

The light-emitting diode (LED) is a kind of semiconductor diodes. It can transfer the electric energy into the luminous energy and emits visible light in yellow, green, blue and the like as well as infrared and ultraviolet invisible light. Compared with incandescent light bulbs and neon lamps, light-emitting diodes are advantaged at low working voltage and current, high reliability, long service life and ease of luminance regulation, etc. Since the development of LED, its luminance is constantly improved and its application extends widely thanks to research development.

In recent years, high-power LED becomes a key development field of each LED factory to meet luminous demands. In conventional high-power normal-chip LEDs, in general, the light-emitting unit is a single chip featured with high current and low voltage, and the light-emitting efficiency is affected by raising junction temperature when big current is injected to the chip. In recent years, large international factories have successively introduced integrated high-voltage LED chips. The high-voltage LED chip is a kind of small-current and high-voltage LED chip by connecting a plurality of micro-chips by metal wires. Compared with conventional low-voltage LED, it mainly has the following advantages: low dissipation power, high power conversion efficiency, low packaging cost, etc. However, the chip process becomes complex due to the serial technology of a plurality of chip grains, and reliability of the high-voltage LED chip is reduced accordingly. Electrostatic discharge (ESD) resistance of the high-voltage chip is relatively poor, which is related increasing probability of ESD failure due to serial connection of a plurality of micro chips, and also related to the ESD resistance of material used during high-voltage chip manufacturing.

SUMMARY

To overcome easy local ESD breakdown/explosion point of a plurality of high-voltage chips during ESD test or each link before LED packaging, the present disclosure provides a chip design scheme to improve ESD resistance of the high-voltage light-emitting diode.

According to a first aspect of the present disclosure, a high-voltage light-emitting diode is provided, which includes:

a substrate and a light-emitting epitaxial laminated layer on the substrate;

wherein, the light-emitting epitaxial laminated layer has a plurality of light-emitting diode units, wherein, the light-emitting diode units at least constitute two rows, and are separated through a channel;

an electrode interconnection line crossing the channel, wherein, two adjacent light-emitting diode units are connected by the electrode interconnection line;

an electrode bonding pad over the outmost light-emitting diode unit of the high-voltage light-emitting diode;

wherein, an insulating protective layer opening is provided at the channel where the potential difference of any two adjacent light-emitting diodes is ≥3 times of a forward voltage of a single light-emitting diode, to avoid breakdown of the light-emitting epitaxial laminated layer, which may be induced by heat produced at the time of dielectric breakdown of the insulating protective layer.

According to a second aspect of the present disclosure, a high-voltage light-emitting diode is provided, which includes:

a substrate and a light-emitting epitaxial laminated layer on the substrate;

wherein, the light-emitting epitaxial laminated layer has a plurality of light-emitting diode units, wherein, the light-emitting diode units at least constitute two rows, and are separated through a channel;

an electrode interconnection line crossing the channel, wherein, two adjacent light-emitting diode units are connected by the electrode interconnection line;

an electrode bonding pad over the outmost light-emitting diode unit of the high-voltage light-emitting diode;

wherein, the first and last light-emitting diode units of any two adjacent light-emitting diode unit rows are adjacent, and an insulating protective layer opening is provided to avoid breakdown of the light-emitting epitaxial laminated layer, which may be induced by heat produced at the time of dielectric breakdown of the insulating protective layer.

According to a third aspect of the present disclosure, a high-voltage light-emitting diode is provided, which includes:

a substrate and a light-emitting epitaxial laminated layer on the substrate;

wherein, the light-emitting epitaxial laminated layer has a plurality of light-emitting diode units, wherein, the light-emitting diode units at least constitute two rows, and are separated through a channel;

an electrode interconnection line crossing the channel, wherein, two adjacent light-emitting diode units are connected by the electrode interconnection line;

an electrode bonding pad over the outmost light-emitting diode unit of the high-voltage light-emitting diode;

a wavelength conversion layer, as an insulating protective layer, over the high-voltage light-emitting diode surface except the electrode bonding pad area;

wherein, the first and last light-emitting diode units of any two adjacent light-emitting diode unit rows are adjacent, and an insulating protective layer opening is provided to avoid breakdown of the light-emitting epitaxial laminated layer, which may be induced by heat produced at the time of dielectric breakdown of the insulating protective layer.

In some embodiments, the light-emitting diode unit includes a first-type semiconductor layer, a light-emitting layer and a second-type semiconductor layer from bottom to up.

In some embodiments, the light-emitting unit is in parallelogram, rectangle, circular or oval.

In some embodiments, except the first and last light-emitting diode units of any two adjacent light-emitting diode unit rows and the electrode bonding pad, which are provided with an insulating protective layer opening, other light-emitting diode units are provided with an insulating protective layer.

In some embodiments, the light-emitting diode unit rows are distributed in C-shaped, inverse-C-shaped, S-shaped, inverse-S-shaped or any of their combinations.

In some embodiments, the insulating protective layer opening is located in the horizontal channel and/or vertical channel of the light-emitting diode unit.

In some embodiments, the insulating protective layer opening is T-shaped, I-shaped, line-shaped or any of their combinations.

In some embodiments, length of the insulating protective layer opening at the horizontal or vertical channel of the light-emitting diode unit is 3 times or above of the channel width.

According to a fourth aspect of the present disclosure, a fabrication method of a high-voltage light-emitting diode is provided, which includes:

providing a substrate, and forming a light-emitting epitaxial laminated layer on the substrate;

patterning the light-emitting epitaxial laminated layer and fabricating a channel that exposes the substrate surface so as to divide the light-emitting epitaxial laminated layer into a plurality of light-emitting diode units, and the light-emitting diode units at least constitute two rows;

fabricating an electrode interconnection line crossing the channel, wherein, two adjacent light-emitting diode units are connected by the electrode interconnection line;

fabricating an electrode bonding pad over the outmost light-emitting diode unit of the high-voltage light-emitting diode;

wherein, an insulating protective layer opening is provided at the channel where the potential difference of any two adjacent light-emitting diodes is ≥3 times of the forward voltage of a single light-emitting diode, to avoid breakdown of the light-emitting epitaxial laminated layer, which may be induced by heat produced at the time of dielectric breakdown of the insulating protective layer.

According to a fifth aspect of the present disclosure, a fabrication method of a high-voltage light-emitting diode is provided, which includes:

providing a substrate, and forming a light-emitting epitaxial laminated layer on the substrate;

patterning the light-emitting epitaxial laminated layer and fabricating a channel that exposes the substrate surface so as to divide the light-emitting epitaxial laminated layer into a plurality of light-emitting diode units, and the light-emitting diode units at least constitute two rows;

fabricating an electrode interconnection line crossing the channel, wherein, two adjacent light-emitting diode units are connected by the electrode interconnection line;

fabricating an electrode bonding pad over the outmost light-emitting diode unit of the high-voltage light-emitting diode;

wherein, an insulating protective layer opening is fabricated between the first and last light emitting diode units of any two adjacent light emitting diode unit rows to avoid breakdown of the light-emitting epitaxial laminated layer, which may be induced by heat produced at the time of dielectric breakdown of the insulating protective layer.

According to a sixth aspect of the present disclosure, a fabrication method of a high-voltage light-emitting diode is provided, which includes:

providing a substrate, and forming a light-emitting epitaxial laminated layer on the substrate;

patterning the light-emitting epitaxial laminated layer and fabricating a channel that exposes the substrate surface so as to divide the light-emitting epitaxial laminated layer into a plurality of light-emitting diode units, and the light-emitting diode units at least constitute two rows;

fabricating an electrode interconnection line crossing the channel, wherein, two adjacent light-emitting diode units are connected by the electrode interconnection line;

fabricating an electrode bonding pad over the outmost light-emitting diode unit of the high-voltage light-emitting diode;

forming a mask layer via yellow light mask process between the first and last light-emitting diode units of any two adjacent light-emitting diode unit rows and the electrode bonding pad;

covering a wavelength conversion layer, as an insulating protective layer, over the high-voltage light-emitting diode surface except the electrode bonding pad area;

removing the mask layer and the wavelength conversion layer over the mask layer to form an insulating protective layer opening between the first and last light-emitting diode units of any two adjacent light-emitting diode unit rows to avoid breakdown of the light-emitting epitaxial laminated layer, which may be induced by heat produced at the time of dielectric breakdown of the insulating protective layer; and fabricating a plurality of high-voltage light-emitting diodes through cutting and separation.

In some embodiments, the substrate is an insulating substrate, which can be a sapphire substrate, an AlN substrate or other non-conducting substrates.

In some embodiments, the light-emitting epitaxial laminated layer is formed through the metal-organic chemical vapor deposition process.

Compared with the prior art, in the high-voltage LED of the present disclosure, an insulating protective layer opening is provided at the channel where the potential difference of any two adjacent light-emitting diodes is ≥3 times of the forward voltage of a single light-emitting diode, to avoid breakdown of the light-emitting epitaxial laminated layer, which may be induced by heat produced at the time of dielectric breakdown of the insulating protective layer. In this way, conventional the ESD pass rate is increased from less than 50% to above 90%, so as to reduce ESD failure profitability and improve high-voltage LED reliability. In addition, the wavelength conversion layer serves as an insulating protective layer to realize packaging (such as chip scale package (CSP)) at the chip fabricating end with low fabricating cost.

In another aspect of the present disclosure, a light-emitting system including a plurality of high-voltage light-emitting diodes is provided. Each high voltage light-emitting diode further includes a substrate and a light-emitting epitaxial laminated layer on the substrate; wherein, the light-emitting epitaxial laminated layer has a plurality of light-emitting diode units, wherein, the light-emitting diode units at least constitute two rows, and are separated through a channel; an electrode interconnection line crossing the channel, wherein, two adjacent light-emitting diode units are connected by the electrode interconnection line; an electrode bonding pad over the outmost light-emitting diode unit of the high-voltage light-emitting diode; an insulating protective layer over the high-voltage light-emitting diode surface except the electrode bonding pad area; wherein: an insulating protective layer opening is provided at the channel where the potential difference of any two adjacent light-emitting diodes is ≥3 times of a forward voltage of a single light-emitting diode, to avoid breakdown of the light-emitting epitaxial laminated layer, which may be induced by heat produced at the time of dielectric breakdown of the insulating protective layer.

In another aspect of the present disclosure, a light-emitting system including a plurality of high-voltage light-emitting diodes is provided. Each high voltage light-emitting diodes further includes a substrate and a light-emitting epitaxial laminated layer on the substrate; wherein, the light-emitting epitaxial laminated layer has a plurality of light-emitting diode units, wherein, the light-emitting diode units at least constitute two rows, and are separated through a channel; an electrode interconnection line crossing the channel, wherein, two adjacent light-emitting diode units are connected by the electrode interconnection line; an electrode bonding pad over the outmost light-emitting diode unit of the high-voltage light-emitting diode; an insulating protective layer over the high-voltage light-emitting diode surface except the electrode bonding pad area; wherein, an insulating protective layer opening is provided between the first and the last light-emitting diode units of any two adjacent light-emitting diode unit rows, to avoid breakdown of the light-emitting epitaxial laminated layer, which may be induced by heat produced at the time of dielectric breakdown of the insulating protective layer.

Other features and advantages of various embodiments of the present disclosure will be described in detail in the following specification, and it is believed that such features and advantages will become more obvious in the specification or through implementations of the present disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

In the drawings.

101: substrate; 102: light-emitting epitaxial layer; 103: electrode interconnection line; 104: electrode bonding pad; 105: insulating protective layer; 106: insulating protective layer opening;

201: substrate; 202: light-emitting epitaxial layer; 203: electrode bonding pad; 204: mask layer; 205: insulating protective layer.

DETAILED DESCRIPTION

The LED structure and the fabrication method of the present disclosure will be described in detail with reference to the accompanying drawings, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of the present disclosure.

Embodiment 1

Figure 1:
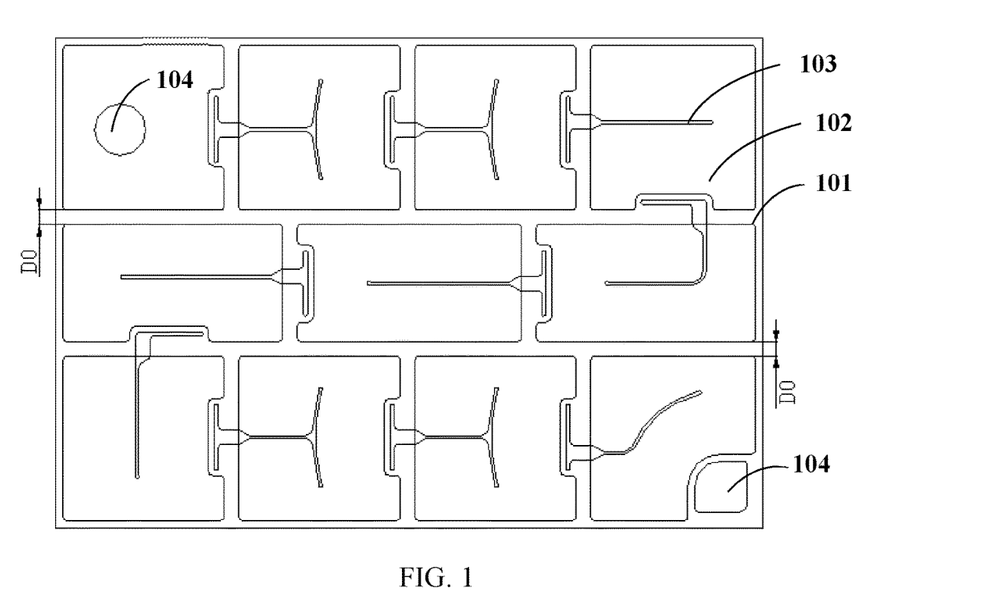
FIG. 1 shows a structural diagram of a high-voltage light-emitting diode not covered with an insulating protective layer according to Embodiment 1 of the present disclosure.
Figure 2:
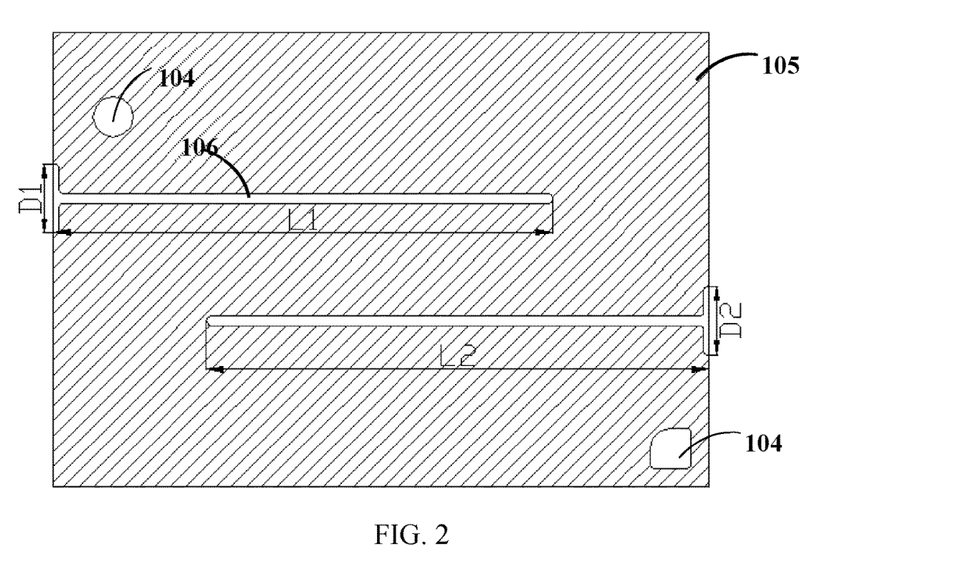
FIG. 2 shows a structural diagram of a high-voltage light-emitting diode covered with an insulating protective layer according to Embodiment 1 of the present disclosure.

To solve electrostatic discharge (ESD) damage of high-voltage chips, this embodiment provides a high-voltage light-emitting diode, as shown in FIGS. 1-2, which includes a substrate 101, and a light-emitting epitaxial laminated layer 102 on the substrate; wherein, the light-emitting epitaxial laminated layer has 11 light-emitting diode units, and the light-emitting diode units form 3 rows, and are distributed in inverse-S-shaped (it is not limited to aforesaid number and arrangement), wherein the first row and the third row comprise 4 light-emitting diode units respectively, and the second row comprises 3 light-emitting diode units, and light-emitting diode units are separated from each other by a channel; an electrode interconnection line 103 crossing the channel, wherein, two adjacent light-emitting diode units are connected by the electrode interconnection line; an electrode bonding pad 104 over the outmost light-emitting diode unit of the high-voltage light-emitting diode; a wavelength conversion, as an insulating protective layer 105, covering the high-voltage light-emitting diode surface except between the adjacent first and last light-emitting diode units of any two adjacent light-emitting diode unit rows and the electrode bonding pad; i.e., forming an insulating protective layer opening at the part prone to ESD failure between adjacent chip grains (i.e., adjacent chip grains with large potential difference) to avoid breakdown of the light-emitting epitaxial laminated layer, which may be induced by heat produced at the time of dielectric breakdown of the insulating protective layer, thus improving reliability of the high-voltage light-emitting diode.

The insulating opening of this embodiment is T-shaped, wherein, lengths of the insulating opening at the horizontal channel are defined as L1 and L2, and lengths at the vertical channel are defined as D1 and D2; and the channel width is defined as D0, wherein, D0 is generally designed as 10 μm or above. To prevent the edge light-emitting diode (micro chip grain) from being impacted by high ESD voltage, L1 and L2 shall be long enough as much as possible, and it is best that the channel area length where the potential difference of adjacent micro chip grains is larger than or equals to 3 times of the voltage of a single micro chip grain is shorter than L1 or L2. In addition, the upper and lower adjacent micro chip grains (with highest relative potential difference) at the outmost area of each light-emitting diode unit row may have dielectric breakdown effect caused by edge electric field. Therefore, vertical channels must be designed; in general, vertical channel lengths D1 and D2 are 3 times and above of D0; in consideration of photoelectric property and ESD resistance, D1 and D2 prefer to be 60 μm, which reduces effective electric-field intensity of the edge insulating protective layer of adjacent light-emitting diodes (micro chip grains) at the chip edge to ⅓ or below of original one, thus improving ESD resistance of high-voltage LED chip.

To sum up, an insulating protective layer opening is provided in the position with large potential difference between two adjacent light-emitting diodes (the position prone to ESD failure) to increase effective width of the medium between adjacent light-emitting diodes with high potential difference. This greatly reduces electric field intensity of the insulating protective layer (medium layer) during ESD loading and reduces ESD failure probability due to dielectric breakdown, thus improving reliability of high-voltage LED.

Embodiment 2

Figure 3:
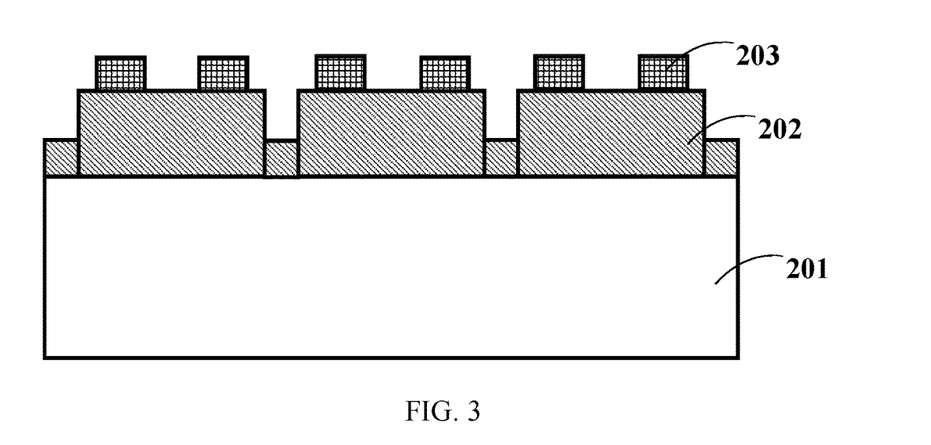
FIG. 3 shows a first step of a process diagram for fabricating a high-voltage light-emitting diode according to Embodiment 2 of the present disclosure: fabricate a light-emitting diode wafer containing a plurality of light-emitting diode units.
Figure 4:
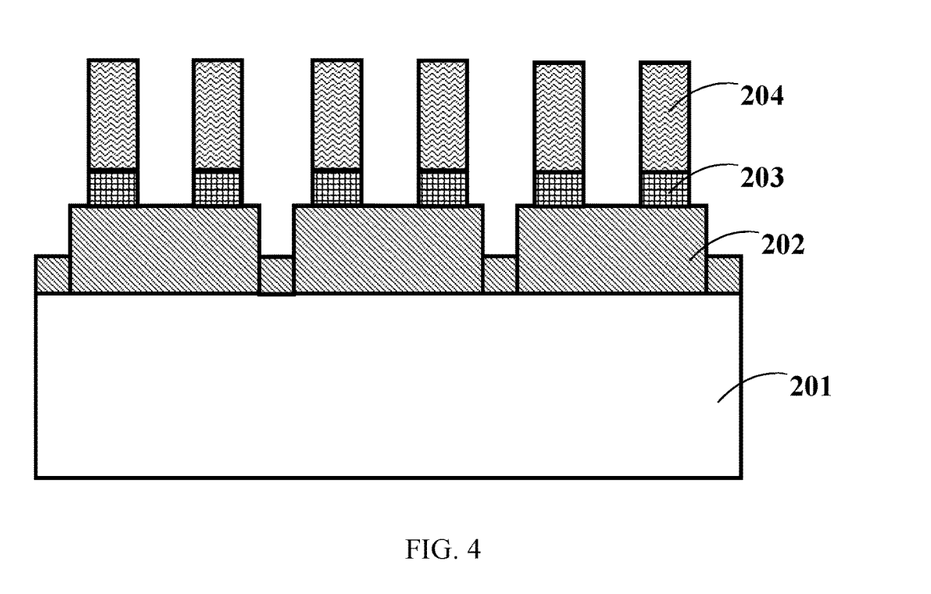
FIG. 4 shows a second step of a process diagram for fabricating a high-voltage light-emitting diode according to Embodiment 2 of the present disclosure: form a mask layer 204 on the electrode bonding pad.
Figure 5:
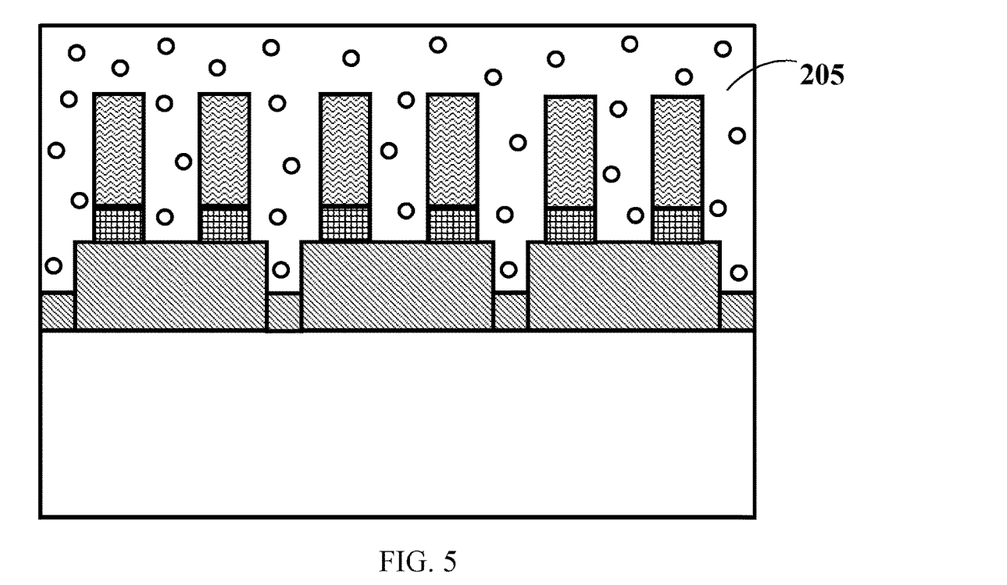
FIG. 5 shows a third step of a process diagram for fabricating a high-voltage light-emitting diode according to Embodiment 2 of the present disclosure: cover a wavelength conversion layer over the high-voltage LED surface as an insulating protective layer 205.
Figure 6:
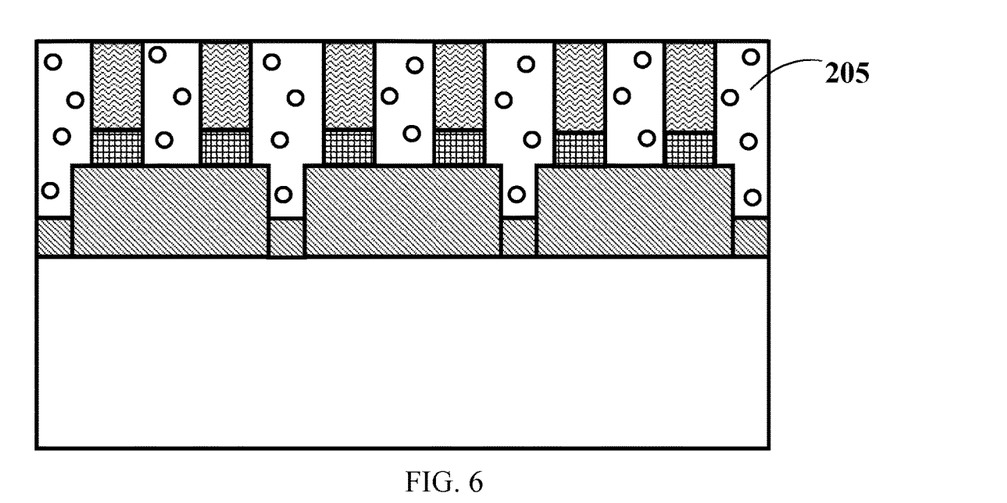
FIG. 6 shows a fourth step of a process diagram for fabricating a high-voltage light-emitting diode according to Embodiment 2 of the present disclosure: flatten the chip surface to expose the photoresist.
Figure 7:
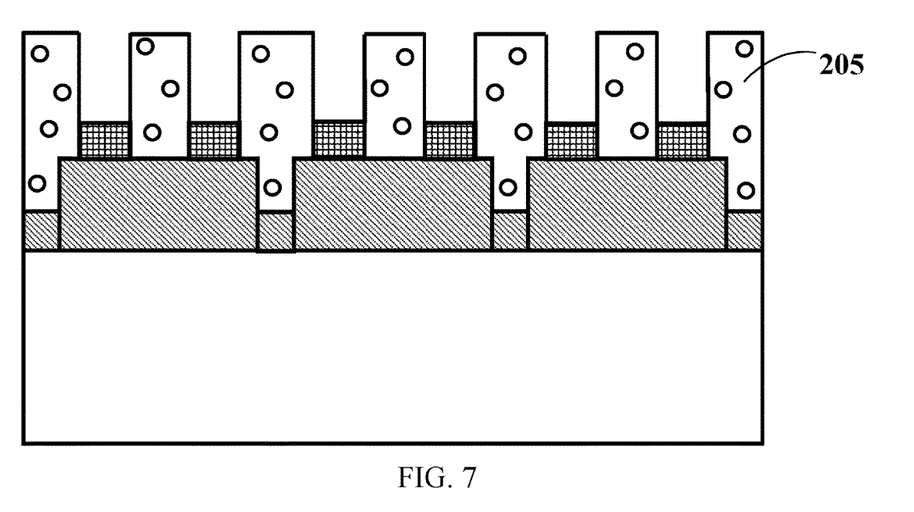
FIG. 7 shows a fifth step of a process diagram for fabricating a high-voltage light-emitting diode according to Embodiment 2 of the present disclosure: remove the photoresist and the phosphor on the photoresist and form an insulating protective layer opening.
Figure 8:
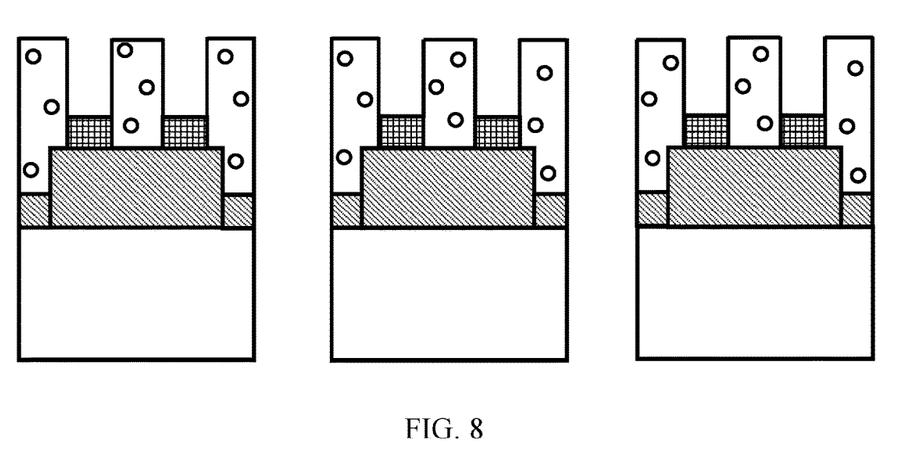
FIG. 8 shows a sixth step of a process diagram for fabricating a high-voltage light-emitting diode according to Embodiment 2 of the present disclosure: fabricate a plurality of high-voltage light-emitting diodes.

With reference to FIGS. 3-8, a fabrication process of a high-voltage light-emitting diode according to this embodiment includes the steps in below:

With reference to FIG. 3, provide a substrate 201 for epitaxial growth, which prefers to be a sapphire insulating substrate, or can be aluminum nitride or other non-conductive substrates; form a light-emitting epitaxial laminated layer 202 on the substrate 201 through metal-organic chemical vapor deposition, comprising an N-type semiconductor layer, a light-emitting layer and a P-type semiconductor layer from bottom to up; pattern the light-emitting epitaxial laminated layer via dry/wet etching process and form a channel that exposes the surface of the substrate 201 so as to divide the light-emitting epitaxial laminated layer into a plurality of high-voltage LED light-emitting units (the figure only shows 3 high-voltage LED light-emitting units. However, number of light-emitting units is not limited to 3, which can be increased based on requirement), thus forming a light-emitting diode wafer, wherein, the light-emitting unit comprises an N-type semiconductor layer, a light-emitting layer and a P-type semiconductor layer from bottom to up; fabricate an electrode interconnection line (not shown in FIG. 3; refer to FIG. 1) crossing the channel, wherein, two adjacent light-emitting diode units are connected by the electrode interconnection line; and fabricate an electrode bonding pad 203 over the outmost light-emitting diode unit of the high-voltage light-emitting diode;

With reference to FIG. 4, fabricate an insulating protective layer opening via yellow light mask process at the channel where the potential difference of any two adjacent light-emitting diodes is ≥3 times of the forward voltage of a single light-emitting diode, such as between the first and last light-emitting diode units of any two adjacent light-emitting diode unit rows (not shown in FIG. 4; refer to FIG. 1), and form a mask layer 204 on the electrode bonding pad, which can be photoresist;

With reference to FIG. 5, cover a wavelength conversion layer over the high-voltage LED surface, such as a mixture of fluorescent powder and glue (phosphor), as an insulating protective layer 205;

With reference to FIG. 6, flatten the chip surface coated with phosphor via mechanical grinding to expose the photoresist;

With reference to FIG. 7, remove the photoresist and the phosphor on the photoresist to expose the electrode bonding pad for subsequent wire bonding; form an insulating protective layer opening between the adjacent first and last light-emitting diode units of any two adjacent light-emitting diode unit rows to avoid breakdown of the light-emitting epitaxial laminated layer, which may be induced by heat produced at the time of dielectric breakdown of the insulating protective layer;

With reference to FIG. 8, fabricate a plurality of high-voltage light-emitting diodes through cutting and separation.

Embodiment 3

Figure 9:
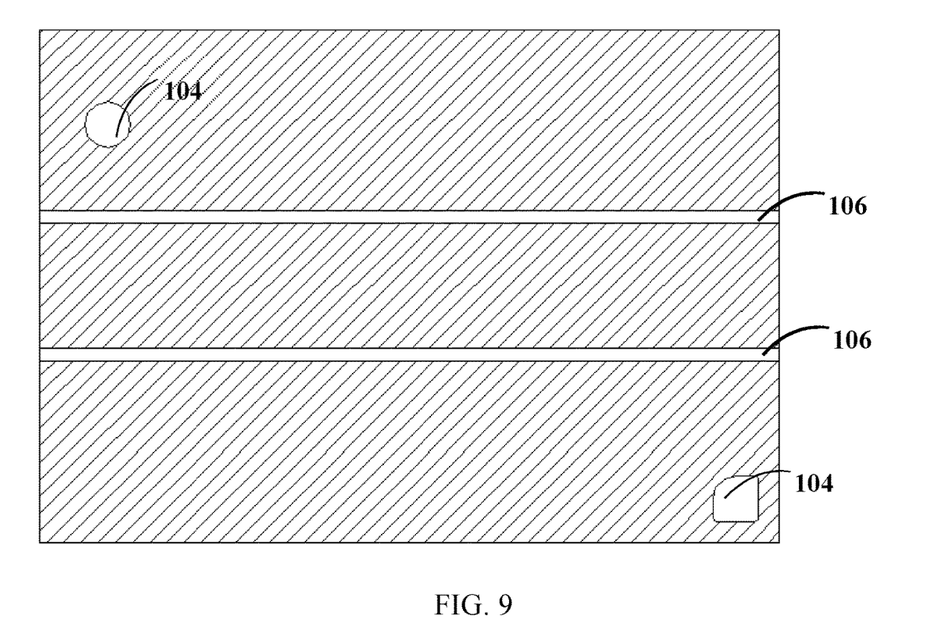
FIG. 9 shows a structural schematic diagram of a high-voltage light-emitting diode according to Embodiment 3 of the present disclosure.

With reference to FIG. 9, the difference between this embodiment and Embodiment 1 is that: the insulating protective layer 106 of this embodiment is $SiO_2$, and the insulating protective layer opening is line-shaped, and distributed on the horizontal channel of each light-emitting diode unit row.

Embodiment 4

Figure 10:
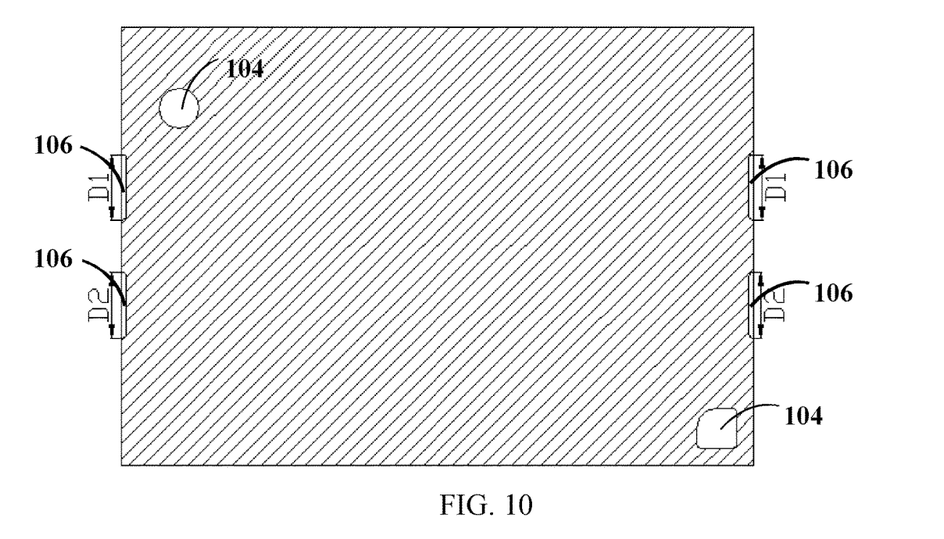
FIG. 10 shows a structural schematic diagram of a high-voltage light-emitting diode according to Embodiment 4 of the present disclosure.

With reference to FIG. 10, the difference between this embodiment and Embodiment 3 is that: the insulating protective layer 106 of this embodiment is SiN, and the insulating protective layer opening is line-shaped, and distributed in the "corner" of the vertical channel of each light-emitting diode unit row.

Embodiment 5

Figure 11:
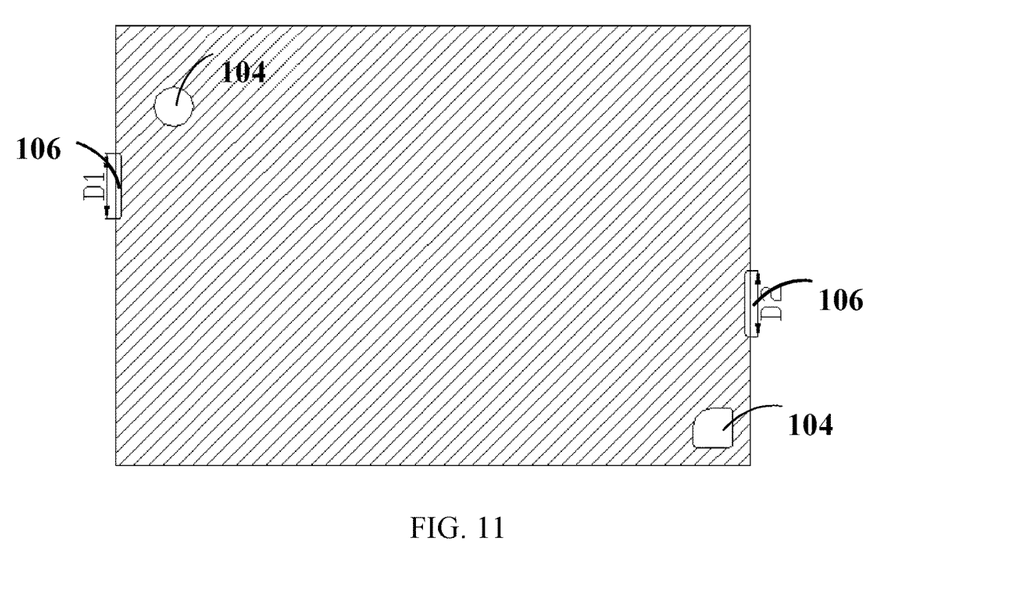
FIG. 11 shows a structural schematic diagram of a high-voltage light-emitting diode according to Embodiment 5 of the present disclosure.

With reference to FIG. 11, the difference between this embodiment and Embodiment 4 is that: the insulating protective layer opening 106 of this embodiment is only distributed in the vertical channel with large potential differential at the "corner" of each light-emitting diode unit row, i.e., distributed between the first and last light-emitting diode units of two adjacent light-emitting diode unit rows.

Embodiment 6

Figure 12:
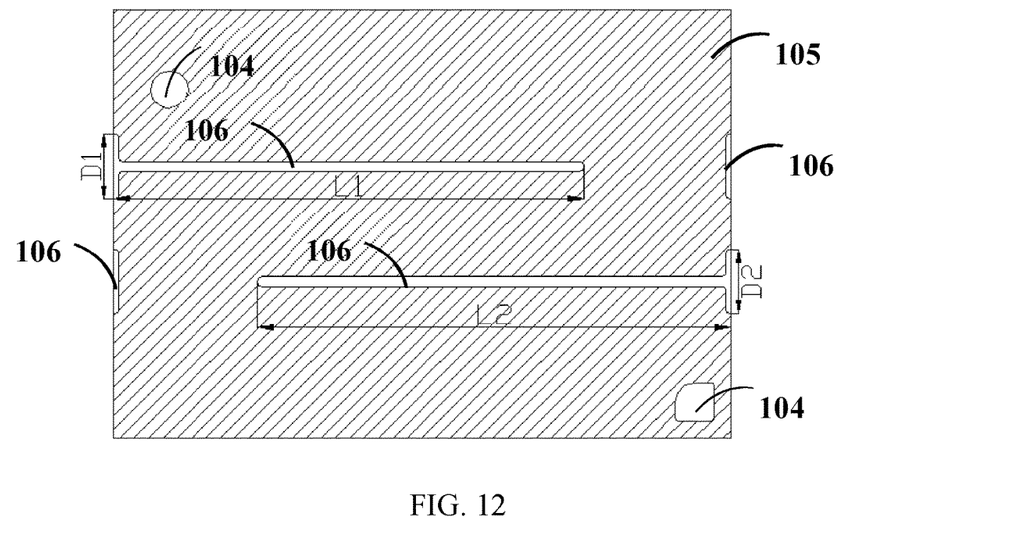
FIG. 12 shows a structural schematic diagram of a high-voltage light-emitting diode according to Embodiment 6 of the present disclosure.

With reference to FIG. 12, the difference between this embodiment and Embodiment 3 is that: besides a T-shaped insulating protective layer opening 106, this embodiment also comprises a line-shaped insulating protective layer opening, wherein, the insulating protective layer opening is distributed in the horizontal channel of each light-emitting diode unit row, and the "corner" of the vertical channel of each light-emitting diode unit row.

Embodiment 7

Figure 13:
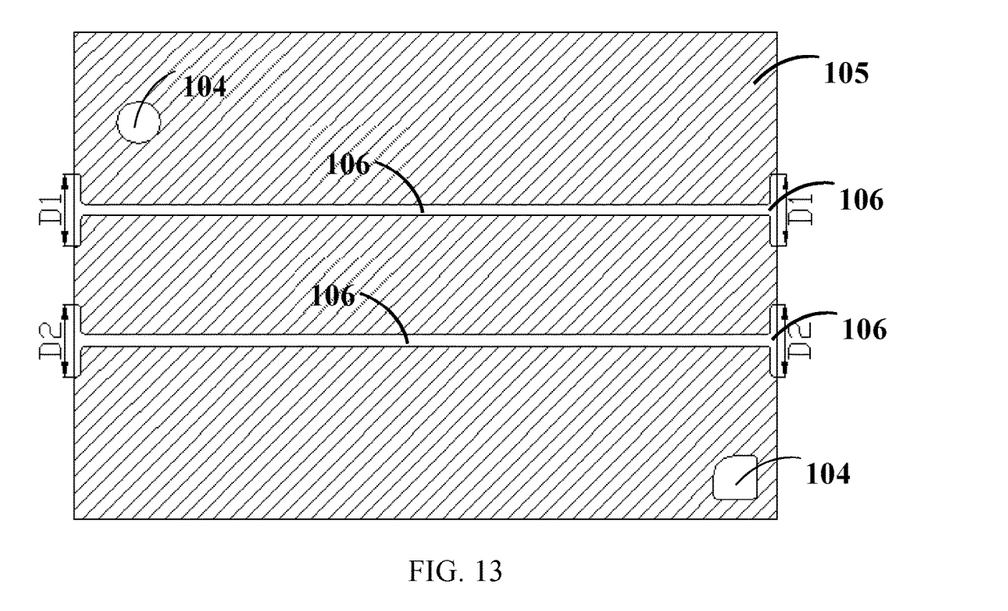
FIG. 13 shows a structural schematic diagram of a high-voltage light-emitting diode according to Embodiment 7 of the present disclosure.

With reference to FIG. 13, the difference between this embodiment and Embodiment 2 is that: The insulating protective layer opening 106 of the embodiment is I-shaped, i.e., the insulating protective layer opening at the horizontal channel passes through to the insulating protective layer opening at the vertical cutting channel to increase ESD resistance of the high-voltage light-emitting diode.

Embodiment 8

Different from Embodiment 1, in this embodiment, a high-voltage LED chip (referring to FIG. 1) without an insulating protective layer structure is provided, where high voltage (large potential differential) between adjacent chip grains can be released by air discharge, thus avoiding breakdown of the LED epitaxial laminated layer, which may be induced by heat produced at the time of dielectric breakdown of the insulating protective layer. To avoid process pollution of chip before packing, package of the high-voltage LED chip of this embodiment can be chip scale package (CSP).

In some other embodiments, a light-emitting system can be provided including a plurality of high-voltage light-emitting diodes. The system can be used in lighting, signage, display, etc. Each high voltage light-emitting diode can include: a substrate and a light-emitting epitaxial laminated layer on the substrate; wherein, the light-emitting epitaxial laminated layer has a plurality of light-emitting diode units, wherein, the light-emitting diode units at least constitute two rows, and are separated through a channel; an electrode interconnection line crossing the channel, wherein, two adjacent light-emitting diode units are connected by the electrode interconnection line; an electrode bonding pad over the outmost light-emitting diode unit of the high-voltage light-emitting diode; an insulating protective layer over the high-voltage light-emitting diode surface except the electrode bonding pad area; wherein, an insulating protective layer opening is provided at the channel where the potential difference of any two adjacent light-emitting diodes is ≥3 times of a forward voltage of a single light-emitting diode, to avoid breakdown of the light-emitting epitaxial laminated layer, which may be induced by heat produced at the time of dielectric breakdown of the insulating protective layer.

In some embodiments, the high-voltage light-emitting diode also comprises a wavelength conversion layer, as an insulating protective layer, over the high-voltage light-emitting diode surface except the electrode bonding pad area.

In some embodiments, the light-emitting diode unit rows are distributed in C-shaped, inverse-C-shaped, S-shaped, inverse-S-shaped or any of their combinations.

In some embodiments, the insulating protective layer opening is located in the horizontal channel and/or vertical channel of the light-emitting diode unit.

In another aspect, a light-emitting system is provided comprising a plurality of high-voltage light-emitting diodes, each high voltage light-emitting diodes further comprises: a substrate and a light-emitting epitaxial laminated layer on the substrate; wherein, the light-emitting epitaxial laminated layer has a plurality of light-emitting diode units, wherein, the light-emitting diode units at least constitute two rows, and are separated through a channel; an electrode interconnection line crossing the channel, wherein, two adjacent light-emitting diode units are connected by the electrode interconnection line; an electrode bonding pad over the outmost light-emitting diode unit of the high-voltage light-emitting diode; an insulating protective layer over the high-voltage light-emitting diode surface except the electrode bonding pad area; wherein, an insulating protective layer opening is provided between the first and the last light-emitting diode units of any two adjacent light-emitting diode unit rows, to avoid breakdown of the light-emitting epitaxial laminated layer, which may be induced by heat produced at the time of dielectric breakdown of the insulating protective layer.

The high-voltage light-emitting diode can be fabricated with various methods. For example, a fabrication method includes: providing a substrate, and forming a light-emitting epitaxial laminated layer on the substrate; patterning the light-emitting epitaxial laminated layer and fabricating a channel that exposes the substrate surface so as to divide the light-emitting epitaxial laminated layer into a plurality of light-emitting diode units, and the light-emitting diode units at least constitute two rows; fabricating an electrode interconnection line crossing the channel, wherein, two adjacent light-emitting diode units are connected by the electrode interconnection line; fabricating an electrode bonding pad over the outmost light-emitting diode unit of the high-voltage light-emitting diode; fabricating an insulating protective layer over the high-voltage light-emitting diode surface except the electrode bonding pad area; wherein, an insulating protective layer opening is fabricated between the first and last light-emitting diode units of any two adjacent light-emitting diode unit rows to avoid breakdown of the light-emitting epitaxial laminated layer, which may be induced by heat produced at the time of dielectric breakdown of the insulating protective layer.

In some embodiments, a fabrication method of a high-voltage light-emitting diode includes: providing a substrate, and forming a light-emitting epitaxial laminated layer on the substrate; patterning the light-emitting epitaxial laminated layer and fabricating a channel that exposes the substrate surface so as to divide the light-emitting epitaxial laminated layer into a plurality of light-emitting diode units, and the light-emitting diode units at least constitute two rows; fabricating an electrode interconnection line crossing the channel, wherein, two adjacent light-emitting diode units are connected by the electrode interconnection line; fabricating an electrode bonding pad over the outmost light-emitting diode unit of the high-voltage light-emitting diode; fabricating a mask layer between the first and last light-emitting diode units of any two adjacent light-emitting diode unit rows and the electrode bonding pad via yellow light mask process; covering a wavelength conversion layer, as an insulating protective layer, over the high-voltage light-emitting diode surface except the electrode bonding pad area; removing the mask layer and the wavelength conversion layer over the mask layer to form an insulating protective layer opening between the first and last light-emitting diode units of any two adjacent light-emitting diode unit rows to avoid breakdown of the light-emitting epitaxial laminated layer, which may be induced by heat produced at the time of dielectric breakdown of the insulating protective layer; and fabricating a plurality of high-voltage light-emitting diodes through cutting and separation.

It should be noted that the channel mentioned in the present disclosure can be not only the channel position but also the part that is beyond the channel and extends to the light-emitting diode surface; and the horizontal channel and the vertical channel mentioned in the present disclosure can be exchanged.

The above embodiments are in no way meant to be limiting, but rather should be taken as illustrative of the general principles and effects of the present disclosure. Any person skilled in the art can make modifications to the above embodiments without departing from the spirit of this disclosure. For example, for the C-shaped or inverse-C-shaped or S-shaped light-emitting diode unit rows, arrange an insulating opening at the portion prone to ESD failure (adjacent micro chip grains with large potential differential). Therefore, the scope of the disclosure should be determined with reference to the claims.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A high-voltage light-emitting diode, comprising:
a substrate and a light-emitting epitaxial laminated layer over the substrate;
wherein, the light-emitting epitaxial laminated layer has a plurality of light-emitting diode units, wherein, the light-emitting diode units at least constitute two rows, and are separated through a channel;
an electrode interconnection line crossing the channel, wherein, two adjacent light-emitting diode units are connected by the electrode interconnection line;
an electrode bonding pad over an outmost light-emitting diode unit of the high-voltage light-emitting diode;
an insulating protective layer over a high-voltage light-emitting diode surface except an electrode bonding pad area;
wherein: the channel forms an insulating protective layer opening at the channel where a potential difference of any two adjacent light-emitting diodes is ≥3 times of a forward voltage of a single light-emitting diode under an electrostatic discharge (ESD) voltage, to avoid breakdown of the light-emitting epitaxial laminated layer, which may be induced by heat produced at a time of dielectric breakdown of the insulating protective layer under the ESD voltage; and
the insulating protective layer opening is located in the channel of the light-emitting diode unit comprising at least one of a horizontal channel or a vertical channel.

2. The high-voltage light-emitting diode of claim 1, wherein: the high-voltage light-emitting diode also comprises a wavelength conversion layer, as an insulating protective layer, over the high-voltage light-emitting diode surface except the electrode bonding pad area.

3. The high-voltage light-emitting diode of claim 1, wherein: the light-emitting diode unit rows are distributed in C-shaped, inverse-C-shaped, S-shaped, inverse-S-shaped or any of their combinations.

4. The high-voltage light-emitting diode of claim 1, wherein, the insulating protective layer opening is T-shaped, I-shaped, line-shaped or any of their combinations.

5. The high-voltage light-emitting diode of claim 4, wherein, length of the insulating protective layer opening at the horizontal or vertical channel of the light-emitting diode unit is 3 times or above of the channel width.

6. A high-voltage light-emitting diode, comprising:
a substrate and a light-emitting epitaxial laminated layer on the substrate;
wherein, the light-emitting epitaxial laminated layer has a plurality of light-emitting diode units, wherein, the light-emitting diode units at least constitute two rows, and are separated through a channel;
an electrode interconnection line crossing the channel, wherein, two adjacent light-emitting diode units are connected by the electrode interconnection line;
an electrode bonding pad over an outmost light-emitting diode unit of the high-voltage light-emitting diode;
an insulating protective layer over a high-voltage light-emitting diode surface except an electrode bonding pad area;
wherein, the channel forms an insulating protective layer opening between a first and a last light-emitting diode units of any two adjacent light-emitting diode unit rows, to avoid breakdown of the light-emitting epitaxial laminated layer, which may be induced by heat produced at a time of dielectric breakdown of the insulating protective layer under an electrostatic discharge (ESD) voltage;
the insulating protective layer opening is T-shaped, I-shaped, line-shaped or any of their combinations; and
length of the insulating protective layer opening at the channel of the light-emitting diode unit is 3 times or higher of a channel width, wherein the channel comprises at least one of a horizontal channel or a vertical channel.

7. The high-voltage light-emitting diode of claim 6, wherein: the high-voltage light-emitting diode also comprises a wavelength conversion layer, as an insulating protective layer, over the high-voltage light-emitting diode surface except the electrode bonding pad area.

8. The high-voltage light-emitting diode of claim 6, wherein: the light-emitting diode unit rows are distributed in C-shaped, inverse-C-shaped, S-shaped, inverse-S-shaped or any of their combinations.

9. The high-voltage light-emitting diode of claim 6, wherein: the insulating protective layer opening is located in the horizontal channel and/or vertical channel of the light-emitting diode unit.

10. A fabrication method of a high-voltage light-emitting diode, comprising:
providing a substrate, and forming a light-emitting epitaxial laminated layer over the substrate;
patterning the light-emitting epitaxial laminated layer and fabricating a channel that exposes the substrate surface so as to divide the light-emitting epitaxial laminated layer into a plurality of light-emitting diode units, and the light-emitting diode units at least constitute two rows;
fabricating an electrode interconnection line crossing the channel, wherein, two adjacent light-emitting diode units are connected by the electrode interconnection line;
fabricating an electrode bonding pad over an outmost light-emitting diode unit of the high-voltage light-emitting diode;
fabricating an insulating protective layer over a high-voltage light-emitting diode surface except an electrode bonding pad area;

wherein, the channel forms an insulating protective layer where a potential difference of any two adjacent light-emitting diodes is ≥3 times of a forward voltage of a single light-emitting diode, to avoid breakdown of the light-emitting epitaxial laminated layer under an electrostatic discharge (ESD) voltage, which may be induced by heat produced at a time of dielectric breakdown of the insulating protective layer under the ESD voltage; and the insulating protective layer opening is located in the channel of the light-emitting diode unit comprising at least one of a horizontal channel or a vertical channel.

11. The method of claim 10, wherein the high-voltage light-emitting diode comprises:

the substrate and the light-emitting epitaxial laminated layer over the substrate;

wherein, the light-emitting epitaxial laminated layer has a plurality of light-emitting diode units, wherein, the light-emitting diode units at least constitute two rows, and are separated through a channel;

an electrode interconnection line crossing the channel, wherein, two adjacent light-emitting diode units are connected by the electrode interconnection line;

an electrode bonding pad over the outmost light-emitting diode unit of the high-voltage light-emitting diode;

an insulating protective layer over the high-voltage light-emitting diode surface except the electrode bonding pad area;

wherein: an insulating protective layer opening is provided at the channel where the potential difference of any two adjacent light-emitting diodes is ≥3 times of a forward voltage of a single light-emitting diode, to avoid breakdown of the light-emitting epitaxial laminated layer, which may be induced by heat produced at the time of dielectric breakdown of the insulating protective layer.

12. The method of claim 10, wherein: the high-voltage light-emitting diode also comprises a wavelength conversion layer, as an insulating protective layer, over the high-voltage light-emitting diode surface except the electrode bonding pad area.

13. The method of claim 10, wherein: the light-emitting diode unit rows are distributed in C-shaped, inverse-C-shaped, S-shaped, inverse-S-shaped or any of their combinations.

14. The method of claim 10, wherein, the insulating protective layer opening is T-shaped, I-shaped, line-shaped or any of their combinations.

15. The method of claim 14, wherein, length of the insulating protective layer opening at the horizontal or vertical channel of the light-emitting diode unit is 3 times or above of the channel width.

* * * * *